US010620253B2

(12) United States Patent
Hejase et al.

(10) Patent No.: US 10,620,253 B2
(45) Date of Patent: Apr. 14, 2020

(54) NOISE MODULATION FOR ON-CHIP NOISE MEASUREMENT

(71) Applicant: International Business Machines Corporation, Armonk, NY (US)

(72) Inventors: Jose A. Hejase, Austin, TX (US); Nanju Na, Essex Junction, VT (US); Nam H. Pham, Round Rock, TX (US); Lloyd A. Walls, Austin, TX (US)

(73) Assignee: International Business Machines Corporation, Armonk, NY (US)

(*) Notice: Subject to any disclaimer, the term of this patent is extended or adjusted under 35 U.S.C. 154(b) by 57 days.

(21) Appl. No.: 15/797,440

(22) Filed: Oct. 30, 2017

(65) Prior Publication Data

US 2018/0045766 A1     Feb. 15, 2018

Related U.S. Application Data

(63) Continuation of application No. 14/299,257, filed on Jun. 9, 2014, now Pat. No. 9,835,665, which is a continuation of application No. 14/228,472, filed on Mar. 28, 2014, now Pat. No. 9,797,938.

(51) Int. Cl.
| *G01R 27/26* | (2006.01) |
| *G01R 29/26* | (2006.01) |
| *G01R 31/00* | (2006.01) |
| *G01R 31/3187* | (2006.01) |

(52) U.S. Cl.
CPC .......... *G01R 29/26* (2013.01); *G01R 31/001* (2013.01); *G01R 31/3187* (2013.01)

(58) Field of Classification Search
CPC .............. G01R 29/26; G01R 31/31709; G01R 31/2646

USPC .................................. 324/613, 76.39, 750.3
See application file for complete search history.

(56) References Cited

U.S. PATENT DOCUMENTS

| 5,430,292 A | * | 7/1995 | Honjo ....................... G03F 1/86 |
| | | | 250/310 |
| 6,072,690 A | | 6/2000 | Farooq et al. |
| 6,118,293 A | | 9/2000 | Manhaeve et al. |
| 6,141,374 A | | 10/2000 | Burns |

(Continued)

OTHER PUBLICATIONS

"U.S. Appl. No. 14/228,472 FAIIP PreInterview Communication", dated May 11, 2016, 9 pages.

(Continued)

*Primary Examiner* — Giovanni Astacio-Oquendo
(74) *Attorney, Agent, or Firm* — Steven R. Gilliam; Rodney L. Lacy; Brian M. Restauro

(57) ABSTRACT

Functionality for estimating characteristics of an on-chip noise signal can be implemented on a processing module. An on-chip noise signal is determined at an on-chip determination point of a computer chip. The on-chip noise signal is converted to a frequency-varying signal using a voltage-controlled oscillator implemented on the computer chip. The frequency-varying signal is measured at an off-chip measurement point and frequency information is extracted from the frequency-varying signal. The frequency information is converted to a voltage level associated with the on-chip noise signal based on the relationship between an input voltage provided to the voltage-controlled oscillator and an output frequency generated by the voltage-controlled oscillator.

20 Claims, 6 Drawing Sheets

(56) References Cited

U.S. PATENT DOCUMENTS

| | | | |
|---|---|---|---|
| 6,221,860 | B1 | 4/2001 | Bondinell et al. |
| 6,617,972 | B2 * | 9/2003 | Takarada ............ G08B 21/0484 324/538 |
| 7,129,734 | B2 | 10/2006 | Geiger et al. |
| 8,779,729 | B2 * | 7/2014 | Shiraishi ............... G06F 1/3212 320/155 |
| 2003/0056124 | A1 | 3/2003 | Amick et al. |
| 2003/0094937 | A1 | 5/2003 | Soma et al. |
| 2004/0148580 | A1 | 7/2004 | Obaldia et al. |
| 2006/0076503 | A1 * | 4/2006 | Tsao ...................... H01J 37/228 250/396 R |
| 2006/0273263 | A1 * | 12/2006 | Raymond .......... G01B 11/0616 250/492.2 |
| 2008/0136427 | A1 | 6/2008 | Cases et al. |
| 2009/0168939 | A1 | 7/2009 | Constantinidis et al. |
| 2010/0321050 | A1 | 12/2010 | Agarwal et al. |
| 2012/0098518 | A1 * | 4/2012 | Unagami ............. G01R 22/066 324/74 |
| 2012/0257694 | A1 | 10/2012 | Balakrishnan |
| 2013/0285696 | A1 | 10/2013 | Chua-Eoan et al. |
| 2015/0276838 | A1 | 10/2015 | Hejase et al. |
| 2015/0276840 | A1 | 10/2015 | Hejase et al. |
| 2016/0191232 | A1 | 6/2016 | Subburaj et al. |
| 2016/0377669 | A1 | 12/2016 | Manipatruni et al. |

OTHER PUBLICATIONS

"U.S. Appl. No. 14/228,472 FAIIP Office Action Summary", dated Jul. 20, 2016, 5 pages.

"U.S. Appl. No. 14/228,472 Office Action", dated Mar. 6, 2017, 10 pages.

"U.S. Appl. No. 14/299,257 Office Action", dated Feb. 28, 2017, 7 pages.

"U.S. Appl. No. 14/299,257 Office Action", dated Jul. 29, 2016, 10 pages.

Alon, et al., "Circuits and Techniques for High-Resolution Measurement of On-Chip Power Supply Noise", IEEE Journal of Solid-State Circuits, vol. 40, No. 4, Apr. 2005, Apr. 2005, pp. 820-828.

Makie-Fukuda, et al., "Voltage-Comparator-Based Measurement of Equivalently Sampled Substrate Noise Waveforms in Mixed-Signal Integrated Circuits", IEEE Journal CIF Solid-State Circuits, vol. 31, No. 5 . May 1996, May 1996, pp. 726-731.

Sato, et al., "Non-invasive direct probing for on-chip voltage measurement", IEEE publication; 2008 International SoC Design Conference, 2008, pp. 354-357.

* cited by examiner

NOISE MODULATION FOR ON-CHIP NOISE MEASUREMENT

RELATED APPLICATIONS

This application is a Continuation of, and claims the priority benefit of, U.S. application Ser. No. 14/299,257 filed Jun. 9, 2014, which claims the priority benefit of U.S. application Ser. No. 14/228,472 filed Mar. 28, 2014.

BACKGROUND

Embodiments of the inventive subject matter generally relate to the field of computing devices and, more particularly, to noise modulation for on-chip noise measurement.

The performance of a computer chip may be affected by noise (e.g., cross-talk with other signals, electromagnetic noise, interference, etc.). It is necessary to characterize the noise experienced on the computer chip ("on-chip noise") to design the computer chip for noise tolerance, to cancel the noise at the computer chip, etc.

SUMMARY

Various embodiments for on-chip noise measurement are disclosed. In one embodiment, an on-chip noise signal is determined at an on-chip determination point on a computer chip. The on-chip noise signal is converted to a frequency-varying signal using a voltage-controlled oscillator. The frequency-varying signal is provided to an off-chip noise estimation unit that is external to the computer chip. Frequency information is extracted from the frequency-varying signal. The frequency information is converted to a voltage level associated with the on-chip noise signal.

BRIEF DESCRIPTION OF THE DRAWINGS

The present embodiments may be better understood, and numerous objects, features, and advantages made apparent to those skilled in the art by referencing the accompanying drawings.

DESCRIPTION OF EMBODIMENT(S)

Figure 1:
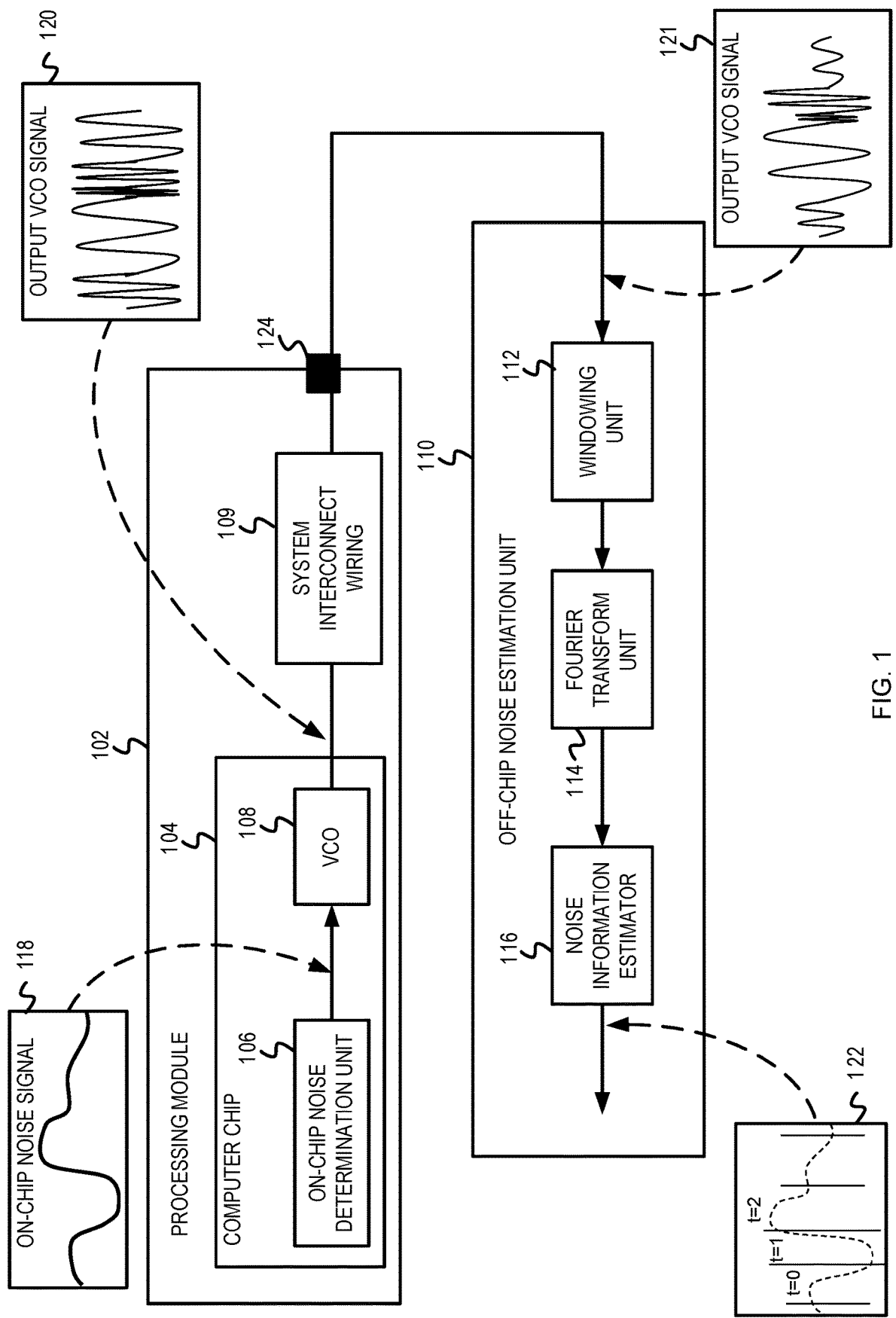
FIG. 1 is a block diagram illustrating example operations for on-chip noise estimation.

The description that follows includes exemplary systems, methods, techniques, instruction sequences, and computer program products that embody techniques of the present inventive subject matter. However, it is understood that the described embodiments may be practiced without these specific details. For instance, although examples refer to estimating noise characteristics on a computer chip, embodiments are not so limited. In other embodiments, functionality for estimating the noise characteristics can be implemented for a group of computer chips. Furthermore, although examples refer to estimating characteristics of a noise signal; in other embodiments, the operations described herein may be executed to estimate the characteristics of other types of signals (e.g., data signals). In other instances, well-known instruction instances, protocols, structures, and techniques have not been shown in detail in order not to obfuscate the description.

Noise estimation and compensation relies on knowledge of the characteristics of the noise signal (e.g., amplitude, periodicity, etc.) within a computer chip ("on-chip noise signal") implemented on a processing module. However, because of limited access to the computer chip, it may not be possible to measure the on-chip noise signal at an on-chip determination point. Existing techniques employ connecting traces or wires between the on-chip noise determination point and a remote measurement point (or "off-chip measurement point") at the exterior of the processing module to measure the on-chip noise signal. However, signal degradation sources (e.g., connecting traces and wires, processing module housing, interference/cross-talk from other signals, etc.) can degrade the noise signal as the noise signal travels from the on-chip determination point to the off-chip measurement point. This signal degradation can affect the characteristics of the on-chip noise signal (e.g., amplitude, shape, and nature of the on-chip noise signal). Consequently, the on-chip noise signal received at the off-chip measurement point may have different characteristics from and may be an inaccurate measure of the on-chip noise signal.

A voltage-controlled oscillator (VCO) can be implemented within the computer chip to estimate characteristics of the on-chip noise in real-time (or approximately real-time) without disrupting normal system operation. The on-chip noise signal is sampled and provided as an input to the VCO. The VCO generates a frequency-varying sinusoidal signal with instantaneous frequencies that correspond to the voltage levels of the on-chip noise signal. The frequency-varying signal is provided through a transfer channel (e.g., a connecting trace) to an off-chip measurement point (e.g., a measurement pin/node at the exterior of a processing module that includes the computer chip). Although the amplitude of the frequency-varying signal is prone to signal degradation described above, the frequency content of the frequency-varying signal suffers negligible degradation. The frequency-varying signal can be further processed to determine voltage level variations of the on-chip noise signal. Representing the voltage level of the on-chip noise signal by frequency variations of a sinusoidal signal can minimize the effects of signal degradation. This can ensure that the characteristics of the on-chip noise signal that are measured at the off-chip measurement point are an accurate representation of the actual characteristics of the on-chip noise signal. Accurate estimation of the on-chip noise signal may also help in designing the computer chip for noise tolerance and/or noise cancellation, in real-time noise cancellation, and in achieving optimal performance.

FIG. 1 is a block diagram illustrating example operations for on-chip noise estimation. FIG. 1 depicts a processing module 102 and an off-chip noise estimation unit 110. The processing module 102 includes at least one computer chip 104. The computer chip 104 includes an on-chip noise determination unit 106 and a voltage-controlled oscillator (VCO) 108. The processing module 102 may be a printed circuit board (PCB) or another suitable module that includes one or more computer chips. The computer chip 104 may be a processor chip, a memory chip, an integrated circuit (IC), a system-on-a-chip (SoC), an application-specific IC (ASIC), etc. The off-chip noise estimation unit 110 comprises a windowing unit 112, a Fourier Transform unit 114, and a noise information estimator 116.

As described above, it may not be possible to measure the on-chip noise signal 118 at an on-chip determination point. Instead, the measurement point 124 for measuring the on-chip noise signal 118 may be external to the computer chip 104, as depicted in FIG. 1. The voltage level (also referred to as amplitude or waveform shape) of a signal may be highly prone to interference and loss through the processing module 102. However, the frequency of the signal may be less prone to interference and loss. The VCO 108 can help combat the effects of interference and loss at an off-chip measurement point 124. The on-chip noise determination unit 106 may periodically sample the on-chip noise signal 118 and provide the sampled noise signal as a control signal to the VCO 108. The control signal (i.e., a sample of the on-chip noise signal 118) controls the instantaneous oscillation frequency of a frequency-varying sinusoidal signal 120 generated by the VCO 108. For example, a 10 mV control signal may cause VCO 108 to generate a 10 MHz output signal; a 20 mV control signal may cause the VCO 108 to generate a 20 MHz output signal; and so on. The frequency-varying signal 120 is provided from the VCO 108 to the off-chip noise estimation unit 110 via system interconnect wiring 109. The system interconnect wiring 109 may represent physical connections (e.g., wires, traces, vias, etc.) between the computer chip 104 and the off-chip noise estimation unit 110. The system interconnect wiring 109 may affect the voltage level of the frequency-varying signal 120 and cause distortion and amplitude variations in the frequency-varying signal 120. Signal 121 represents the frequency-varying signal that is received by the off-chip noise estimation unit 110. The peak-to-peak amplitude of the frequency-varying signal 121 at the input of the noise estimation unit 110 may or may not remain the same as that of the frequency-varying signal 120 generated by the VCO 108. However, the instantaneous frequency of the frequency-varying signal 121 may be the same or approximately the same as the corresponding instantaneous frequency of the frequency-varying signal 120. Thus, the amplitude variations of the on-chip noise signal 118 may be carried over by frequency modulation of a sinusoidal signal associated with the VCO 108.

The frequency-varying signal 121 is provided to the noise estimation unit 110 via the off-chip measurement point 124 (e.g., a processing module pin, a PCB probe node, etc.). The noise estimation unit 110 may further process and extract frequency information from the frequency-varying signal 121. For example, the windowing unit 112 may execute time-windowing operations by dividing the frequency-varying signal 121 into multiple consecutive time intervals ("windows"). For each time interval, the Fourier transform unit 114 may execute Fourier transform operations on samples within the time interval to convert the samples from the time-domain to the frequency-domain. For each time interval, executing the Fourier transform operations can yield frequency information associated with the portion of the frequency-varying signal 121 that lies within the time interval, as will be further described with reference to FIG. 2.

Figure 2:
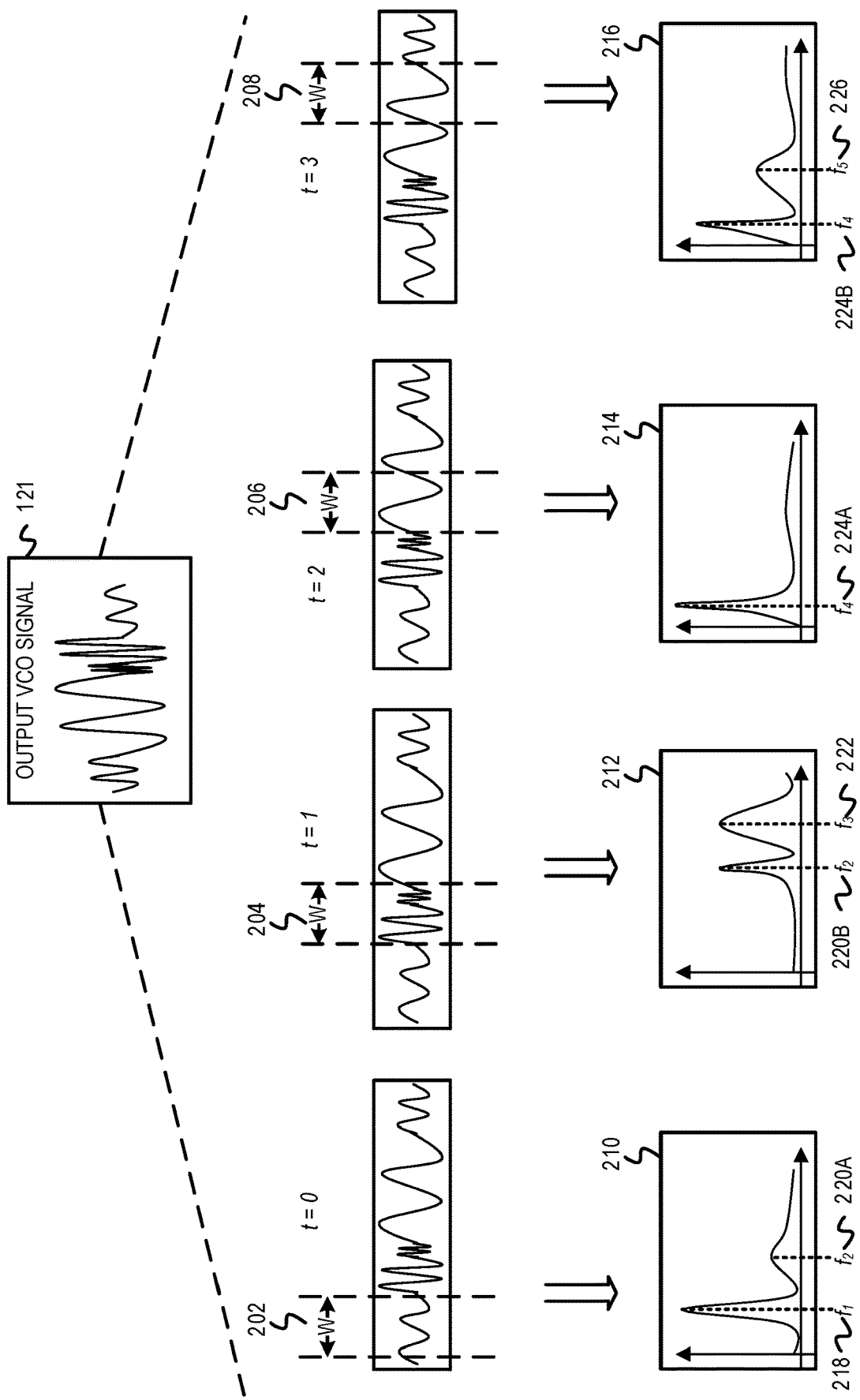
FIG. 2 is an example conceptual diagram illustrating post-processing of a frequency-varying signal to determine characteristics of the on-chip noise signal.

FIG. 2 is an example conceptual diagram illustrating post-processing of the frequency-varying signal to determine characteristics of the on-chip noise signal. The off-chip noise estimation unit 110 receives the frequency-varying signal 121 generated by the VCO 108 and measured at the off-chip measurement point 124. The windowing unit 112 applies a suitable windowing function to the frequency-varying signal 121 to yield a portion (or window represented by W in FIG. 2) of the frequency-varying signal 121 for subsequent analysis. As depicted in FIG. 2, the windowing unit 110 applies the windowing function to generate a first sub-signal 202 from the frequency-varying signal 121 at a first time instant (t=0). The first sub-signal 202 is then provided to the Fourier transform unit 114. The Fourier transform unit 114 can execute Fourier transform operations (e.g., Fast Fourier Transform (FFT) operations) on the first sub-signal 202 to yield a corresponding frequency-domain signal 210. The frequency-domain signal 210 comprises resonant peaks at corresponding resonant frequencies 218 and 220A. In some embodiments, the resonant peak and the corresponding resonant frequency may be identified by comparing the amplitude of the frequency-domain signal 210 against a predefined threshold. The frequencies at which the amplitude of the frequency-domain signal 210 exceeds the predefined threshold may be designated as resonant frequencies. As described above, the VCO 108 converts an input voltage level into an output frequency. Therefore, the resonant frequencies 218 and 220A correspond to a first voltage level and a second voltage level of the on-chip noise signal 118, respectively.

Furthermore, as depicted in FIG. 2, the windowing unit 112 applies the windowing function to generate a second sub-signal 204 at a second time instant (t=1), a third sub-signal 206 at a third time instant (t=2), a fourth sub-signal 208 at a fourth time instant (t=3), and so on. The time instants t=0, 1, 2, 3, etc. may refer to the time instants at which the windowing function is applied to the frequency-varying signal 121. The Fourier transform unit 114 can successively execute Fourier transform operations on the sub-signals 204, 206, and 208 to yield frequency-domain signals 212, 214, and 216 respectively. The frequency-domain signal 212 comprises resonant peaks at resonant frequencies 220B and 222; the frequency-domain signal 214 comprises a resonant peak at resonant frequency 224A; and the frequency-domain signal 216 comprises resonant peaks at resonant frequencies 224B and 226. As discussed above, the resonant peak and the corresponding resonant frequency may be identified by comparing the amplitude of each frequency-domain signal 212, 214, and 216 against a predefined threshold. The frequencies at which the amplitude of the frequency-domain signals 212, 214, and 216 exceed the predefined threshold may be designated as resonant frequencies.

Referring back to FIG. 1, after identifying the resonant frequencies, the noise information estimator 116 (e.g., a frequency-to-voltage translation unit) can map the resonant frequencies to a corresponding voltage level of the on-chip noise signal 118 using a voltage-to-frequency conversion structure. The voltage-to-frequency conversion structure may represent the relationship between the input voltage level provided to the VCO 108 (i.e., the on-chip noise signal 118) and output frequency generated by the VCO 108 (i.e., the instantaneous frequency of the frequency-varying signal 120). The noise information estimator 116 can also execute a calibration process (further described in FIG. 5) to determine the voltage-to-frequency conversion structure (e.g., a graph, a table, or another suitable data structure). The calibration operations may be executed periodically, on start-up, or in accordance with another suitable schedule. In one embodiment, multiple reference DC voltage levels may be provided to the VCO 108 (instead of the on-chip noise signal 118). For each reference DC voltage level, the VCO 108 may generate a sinusoidal output signal with an output frequency that corresponds to the reference DC voltage. For each reference DC voltage level, the frequency of the sinusoidal output signal may be measured at the exterior measurement point 124. The voltage-to-frequency conversion structure may be generated based on knowledge of the reference DC voltage levels and the corresponding output frequency. The calibration process can also account for process, voltage, and temperature variations and other uncertainties within the computer chip 104 that may affect the operation of the VCO 108.

The noise information estimator 116 can use the voltage-to-frequency conversion structure to translate resonant frequencies determined from the frequency-domain signals 210, 212, 214, and 216 to corresponding voltage levels of the on-chip noise signal 118. For example, the resonant frequencies 218 and 220A for the first sub-signal 202 (first window) may correspond to a first and a second voltage level, respectively. The resonant frequencies 220B and 222 for the second sub-signal 204 (second window) may correspond to the second voltage level and a third voltage level, respectively, and so on. In some embodiments, the noise information estimator 116 can determine variations in the voltage level of the on-chip noise signal within a time interval (i.e., window). In another embodiment, the noise information estimator 116 can determine variations in the voltage level of the on-chip noise signal across consecutive time intervals. In another embodiment, the noise information estimator 116 can determine the periodicity of the on-chip noise signal by identifying time intervals that have the same frequency spectrum and/or the same resonant frequencies. In another embodiment, the on-chip noise signal can be reconstructed based on knowledge of the voltage levels during each of the time intervals (as depicted by signal 122). The noise information estimator 116 may track the presence, absence, and changes in the position of the resonant frequencies across the Fourier transforms of the different time intervals to determine the sequence of the resonant frequencies. Based on the sequence of the resonant frequencies, the noise information estimation unit 116 may determine the variation in voltage level of the on-chip noise signal with time.

It is noted that in some embodiments, the time intervals (windows) for executing the Fourier transform operations may be selected so that consecutive time intervals overlap with each other and so that the sampling period is much smaller than the width of the time interval. A fairly accurate reconstruction of the on-chip noise signal may be achieved by selecting overlapping time intervals. Additionally, in some embodiments, the time intervals for executing the Fourier transform operations may be narrow so that there is one resonant frequency per time interval, thus improving the accuracy of the reconstructed on-chip noise signal.

Figure 3:
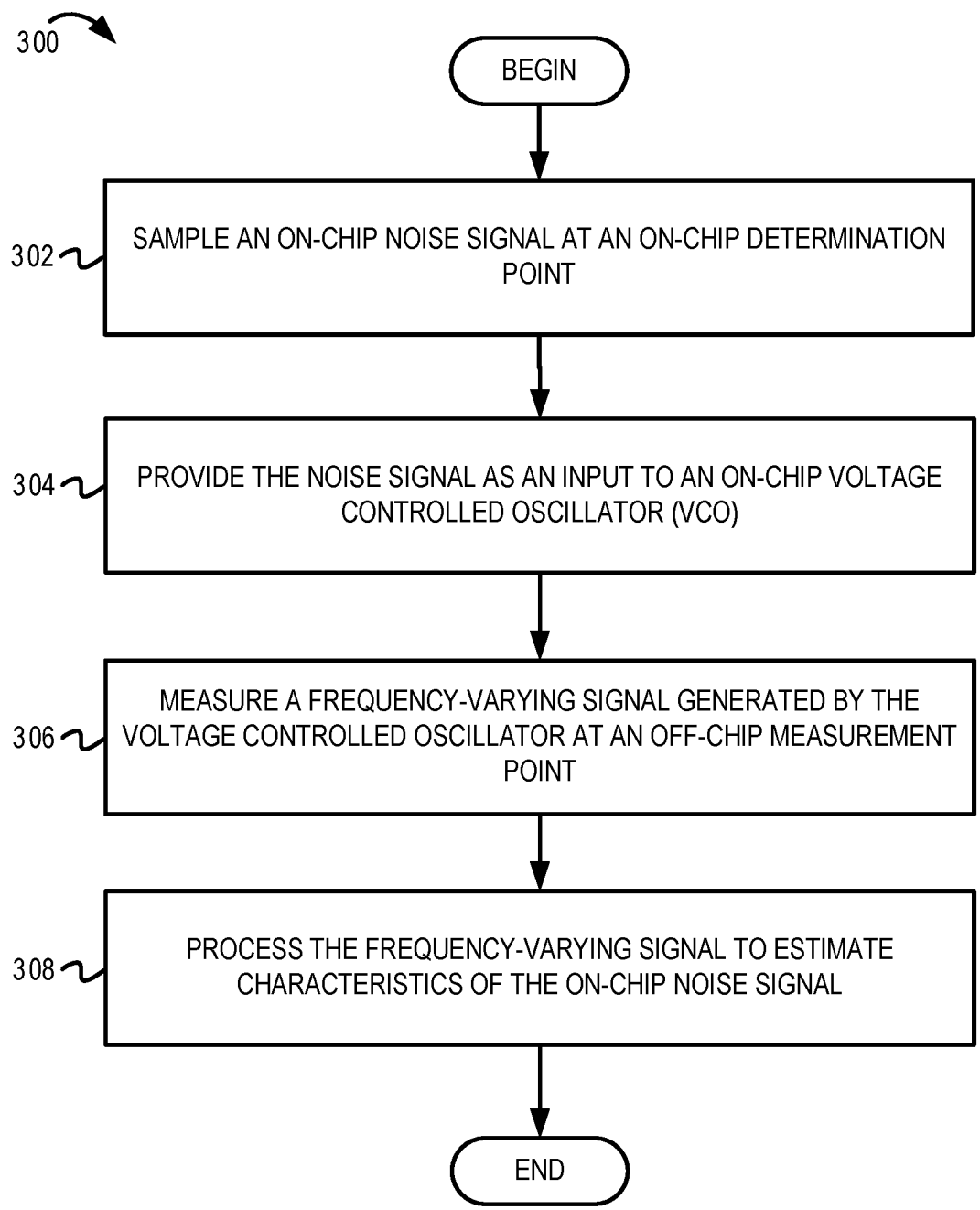
FIG. 3 is a flow diagram illustrating example operations for on-chip noise estimation.

FIG. 3 is a flow diagram ("flow") 300 illustrating example operations for on-chip noise estimation. The flow 300 begins at block 302.

An on-chip noise signal is sampled at an on-chip determination point (block 302). For example, the on-chip noise determination unit 106 may sample the on-chip noise signal 118 measured at an on-chip determination point. The flow continues at block 304.

The noise signal is provided as an input to an on-chip voltage controlled oscillator (block 304). As discussed above with reference to FIGS. 1 and 2, the noise signal controls the oscillation frequency of the VCO 108. A VCO can generate a frequency-varying signal with an instantaneous frequency that is proportional to an instantaneous voltage level of an on-chip noise signal. Because the voltage level of an on-chip noise signal varies with time, the instantaneous frequency of the frequency-varying signal also varies with time. In some embodiments, the fundamental oscillation frequency (or natural oscillation frequency) of a VCO may correspond to a zero input signal (e.g., a 1 V on-chip noise signal). As the voltage level of the on-chip noise signal varies in the positive (or negative) direction, the oscillation frequency of the VCO may also increase (or decrease) relative to the fundamental oscillation frequency. The accuracy of the on-chip noise measurement may depend on the processing speed of the VCO. The flow continues at block 306.

The frequency-varying signal generated by the voltage controlled oscillator is measured at an off-chip measurement point (block 306). The frequency-varying signal may be transmitted from the output of an on-chip VCO to the off-chip measurement point via a transfer channel (e.g., a PCB trace, a physical wire, etc.). Converting voltage level variations of the on-chip noise signal into corresponding frequency variations of the frequency-varying signal can help minimize signal degradation caused by the transfer channel. The flow continues at block 308.

The frequency-varying signal is processed to estimate characteristics of the on-chip noise signal (block 308). For example, an off-chip noise estimation unit can process the signal to determine the characteristics of the on-chip noise signal (e.g., variation of voltage level with time, periodicity, etc.). Operations for estimating the characteristics of the on-chip noise signal from the frequency-varying signal are further described in FIGS. 1-2 and 4. From block 308, the flow ends.

Figure 4:
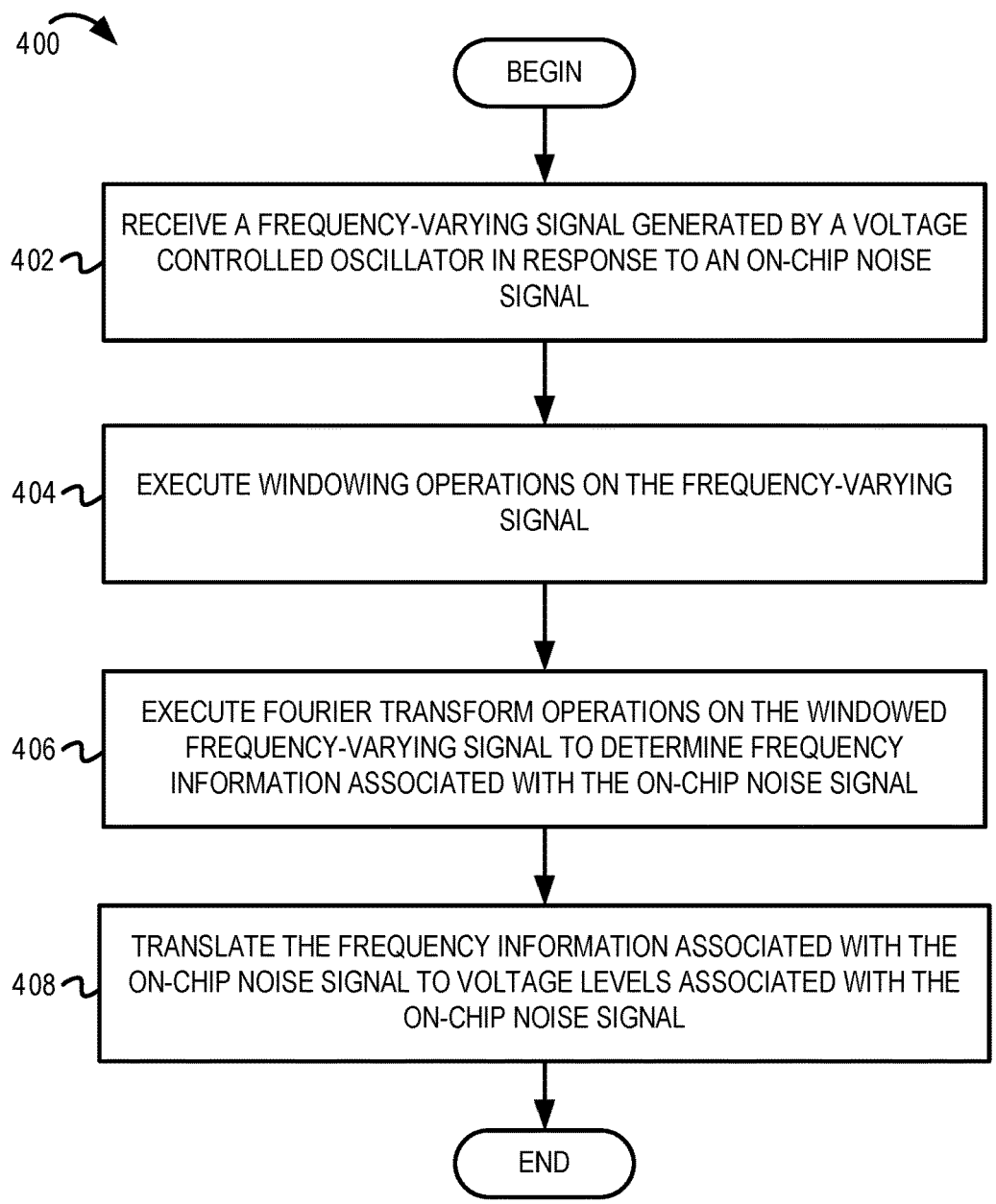
FIG. 4 is a flow diagram illustrating example operations for processing a frequency-varying output signal to estimate characteristics of an on-chip noise signal.

FIG. 4 is a flow diagram 400 illustrating example operations for processing a frequency-varying output signal to estimate characteristics of an on-chip noise signal. The flow 400 begins at block 402.

A frequency-varying signal generated by a voltage-controlled oscillator is received in response to an on-chip noise signal (block 402). As described above, an on-chip noise signal is provided as an input to an on-chip VCO. The VCO can generate the frequency-varying signal with an instantaneous frequency that is proportional to the instantaneous voltage level of the on-chip noise signal. The flow continues at block 404.

Windowing operations are executed on the frequency-varying signal (block 404). For example, a windowing function can be applied to the frequency-varying signal to select a portion (window) of the frequency-varying signal for subsequent spectral analysis. In some embodiments, a rectangular windowing function may be applied to the frequency-varying signal. In other embodiments, another suitable windowing function may be applied to the frequency-varying signal. In some embodiments, the frequency-varying signal may be sampled and the windowing operations may be executed on samples of the frequency-varying signal. In some embodiments, the windows for executing the Fourier transform operations may be selected so that consecutive time intervals overlap with each other and so that the sampling period between windows is much smaller than the duration of the window. This can help achieve a fairly accurate reconstruction of the on-chip noise signal. Additionally, in some embodiments, the windows for executing the Fourier transform operations may be narrow so that there is one resonant frequency per time interval, thus improving the accuracy of the reconstructed on-chip noise signal. The VCO is typically configured to generate a range of frequencies between a lower frequency limit ($f_1$) and an upper frequency limit ($f_2$). The windowing function and the duration of the window (window size) may be selected based, at least in part, on the lower frequency limit of the VCO. For example, the duration of the window may be at least one time period of the lower frequency limit (e.g., $1/f_1$). The flow continues at block 406.

Fourier transform operations are executed on the windowed frequency-varying signal to determine frequency information associated with the on-chip noise signal (block 406). As described with reference to FIG. 2, the Fourier transform operations can be executed for each window of the time-domain frequency-varying signal to yield a corresponding frequency-domain signal. In some embodiments, the amplitude of the frequency-domain signal may be compared against a predefined threshold. The amplitudes that exceed the predefined threshold may be referred to as "resonant peaks" the frequency-domain signal and the frequencies that correspond to the resonant peaks may be referred to as resonant frequencies. The resonant frequencies and the corresponding window of the frequency-varying signal may be referred to as "frequency information" associated with the on-chip noise signal. The frequency information can be used to characterize the on-chip noise signal, for example, as described in FIGS. 1-2. The flow continues at block 408.

The frequency information associated with the on-chip noise signal is translated to voltage levels associated with the on-chip noise signal (block 408). As described in FIGS. 1 and 5, VCO calibration operations may be executed to determine a voltage-to-frequency conversion structure that represents the correlation between an input voltage level provided to a VCO and an output frequency generated by the VCO. Based on the voltage-to-frequency conversion structure, each resonant frequency (determined at block 406) can be translated to a corresponding voltage level of the on-chip noise signal. Additionally, the voltage levels and the corresponding window (i.e., time interval) can be used to estimate characteristics of the on-chip noise signal. For example, variations in the voltage level of the on-chip noise signal may be determined within a time interval (i.e., window). As another example, variations in the voltage level of the on-chip noise signal may be determined across consecutive time intervals. In another embodiment, the periodicity of the on-chip noise signal may be determined by identifying time intervals that have the same frequency spectrum and/or the same resonant frequencies. In another embodiment, the on-chip noise signal may be reconstructed based on knowledge of the voltage levels during each of the time intervals (as depicted by signal 122).

Characteristics of an on-chip noise signal can be used in conjunction with applications executing on a computer chip to determine whether to execute noise cancellation operations. For example, the noise cancellation operations may not be executed if the maximum voltage level of the on-chip noise signal lies below an acceptable noise level for the application(s) executing on the computer chip. In some embodiments, the characteristics of the on-chip noise signal can be fed back to a noise cancellation unit to fine-tune components of the noise cancellation unit. For example, the characteristics of the on-chip noise signal may be used to estimate and tune coefficients of a filter unit. In some embodiments, the noise cancellation unit may be implemented on the computer chip 104. However, in other embodiments, the noise cancellation unit may not be implemented on the computer chip 104 or the processing module 102. In some embodiments, the characteristics of the on-chip noise signal may be stored or provided to post processing units for subsequent noise cancellation. From block 408, the flow ends.

Figure 5:
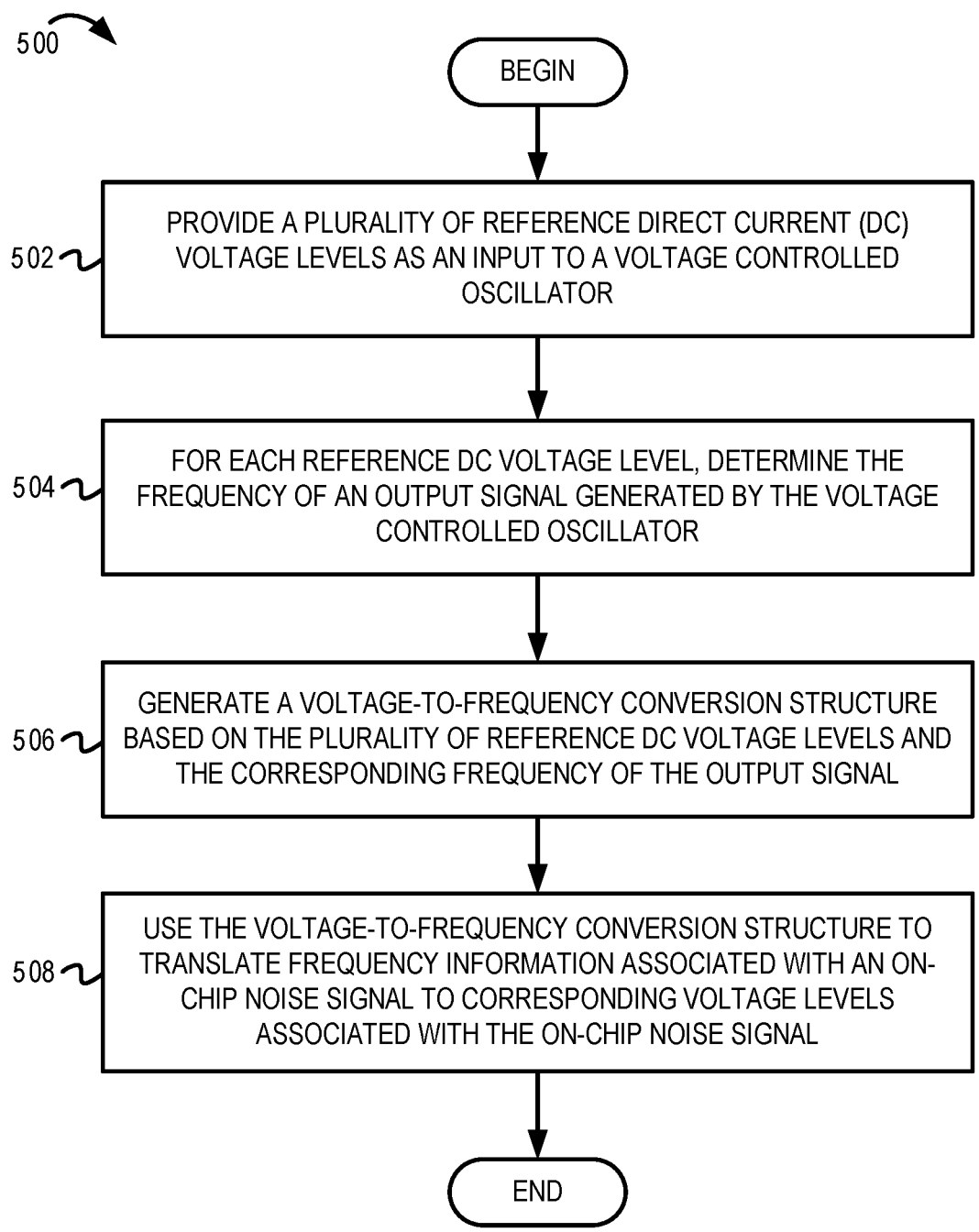
FIG. 5 is a flow diagram illustrating example operations for mapping an input voltage level provided to a voltage-controlled oscillator (VCO) to an output frequency generated by the VCO.

FIG. 5 is a flow diagram 500 illustrating example operations for mapping an input voltage level provided to a VCO to an output frequency generated by the VCO. The flow 500 begins at block 502.

A plurality of reference direct current (DC) voltage levels are provided as an input to a VCO (block 502). As described above, the input voltage level that is provided to the VCO controls the frequency of a sinusoidal signal generated by the VCO. To calibrate the VCO and to determine the correlation between the input voltage level and output frequency, multiple reference DC voltage levels (e.g., signals at 0 Hz with constant amplitude) may be provided to the VCO. The number of reference DC voltage levels provided to the VCO may depend on the characteristics of the VCO. For example, if the VCO is a linear device, two reference DC voltage levels may be sufficient to determine the correlation between the input voltage level and output frequency. The flow continues at block 504.

For each reference DC voltage level, the frequency of an output signal generated by the VCO is determined (block 504). The output signal may be a sinusoidal signal with a frequency that directly corresponds to the reference DC voltage level. Alternatively, the output signal may be a triangular signal, a square-wave signal, or a signal with another suitable waveform shape. Because the DC voltage level provided to the VCO has a constant amplitude, the output signal generated by the VCO has a constant frequency. The frequency of the output signal may be measured at an off-chip measurement point 124 (e.g., a measurement node at the exterior of a processing module, a PCB probe point, etc.). The flow continues at block 506.

A voltage-to-frequency conversion structure is generated based on the plurality of reference DC voltage levels and the corresponding frequency of the output signal (block 506). A suitable interpolation and/or extrapolation technique may be executed to convert the discrete pairs of reference DC voltage level and corresponding output frequency to a voltage-to-frequency conversion structure. For example, curve fitting operations, regression operations, etc. may be employed to construct the voltage-to-frequency conversion structure. The flow continues at block 508.

The voltage-to-frequency conversion structure is used to translate frequency information associated with an on-chip noise signal to corresponding voltage levels associated with the on-chip noise signal (block 508). As described with reference to FIGS. 1-2 and 4, resonant frequencies may be determined from a frequency-domain representation of each window of a frequency-varying output signal generated by the VCO. The resonant frequencies may be translated into corresponding voltage levels based on the voltage-to-frequency conversion structure. From block 508, the flow ends.

It should be understood that FIGS. 1-5 and the operations described herein are examples meant to aid in understanding embodiments and should not be used to limit embodiments or limit scope of the claims. Embodiments may perform additional operations, fewer operations, operations in a different order, operations in parallel, and some operations differently. Although examples describe the noise estimation unit being implemented external to the computer chip and the processing module, embodiments are not so limited. In other embodiments, the noise estimation unit may be implemented external to the computer chip but on the processing module. In another embodiment, the noise estimation unit may be implemented on the computer chip away from the on-chip determination point.

In some embodiments, the noise estimation operations described above may be executed in real-time or quasi real-time (e.g., because of the time delays associated with generating a window of the frequency-varying signal). However, in other embodiments, the noise estimation operations may be executed on previously stored noise signals or noise samples. For example, the on-chip noise signal may be sampled and stored. At a later time, the stored noise samples may be provided to an on-chip VCO and the frequency-varying signal generated by the VCO may be analyzed to estimate characteristics of the on-chip noise signal. As another example, the on-chip noise signal may be sampled and provided to the VCO. The frequency-varying signal generated by the VCO may be stored. At a later time, the stored frequency-varying signal may be analyzed (e.g., sampled, windowed, Fourier transformed, etc.) to estimate the characteristics of the on-chip noise signal. In some embodiments, the noise estimation operations may be executed while other applications are executing on the computer chip. In other embodiments, the noise estimation operations may be executed at start-up or after disabling the applications executing on a computer chip.

In some embodiments, the operations described above may be used to estimate application-specific noise characteristics. For example, a first set of noise characteristics associated with executing a spreadsheet application and a second set of noise characteristics associated with executing a gaming application may be determined. In some embodiments, the noise characteristics may vary depending on the application being executed because of differences in processor workload, switching activity, current demand, etc. The first and second sets of noise characteristics may be analyzed to determine whether and what type of noise cancellation operations should be executed for the application.

Although examples refer to estimating characteristics of a noise signal measured on a computer chip, embodiments are not so limited. In other embodiments, the operations for estimating the characteristics of a noise signal may be executed at a processing module level, for a group of computer chips, etc. Operations for estimating the noise characteristics may be executed to estimate characteristics of any suitable type of noise (e.g., power noise, high-frequency signal noise, etc.) and may be executed in a variety of environments (e.g., noisy environments, hazardous environments, remote measurement environments, etc.). For example, the operations described above may be used for noise estimation on circuits (e.g., computer chips, integrated circuits, etc.) that have a limited number of input/output ports. As another example, when wirelessly measuring radiation that is dangerous to humans, radiation measurements may include noise from the environment. In this example, the operations described above may be executed to characterize the noise (at the measurement point within the radiation environment) for subsequently designing/tuning filters to minimize the noise in the radiation measurement.

Finally, although FIG. 1 describes the noise estimation unit processing the frequency-varying signal received from one VCO (and one computer chip), embodiments are not so limited. In other embodiments, the noise estimation unit may process the frequency-varying signal received from multiple VCOs. For example, a processing system may include multiple computer chips—each computer chip comprising an on-chip VCO. The frequency-varying signal generated by each of the on-chip VCOs may be provided to a common off-chip noise estimation unit. The noise estimation unit may execute operations described above to characterize the on-chip noise signal associated with each of the computer chips. In another embodiment, the computer chip may include multiple determination points (or measurement points) that are each associated with a corresponding on-chip VCO. In one example, a common off-chip noise estimation unit may receive and process the frequency-varying signal generated by each VCO to characterize the on-chip noise signal determined at each determination point on the computer chip. However, in another example, a common on-chip noise estimation unit may process the frequency-varying signal to characterize the on-chip noise signal determined at each determination point if the on-chip noise estimation unit is not affected by noise.

As will be appreciated by one skilled in the art, aspects of the present inventive subject matter may be embodied as a system, method, and/or computer program product. Accordingly, aspects of the present inventive subject matter may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present inventive subject matter may take the form of a computer program product embodied in a computer readable storage medium (or media) having computer readable program instructions embodied thereon. Furthermore, aspects of the present inventive subject matter may be a system, a method, and/or a computer program product. The computer program product may include a computer readable storage medium (or media) having computer readable program instructions thereon for causing a processor to carry out aspects of the present inventive subject matter.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present inventive subject matter may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present inventive subject matter.

Aspects of the present inventive subject matter are described herein with reference to flowchart illustrations and/or block diagrams of methods, apparatus (systems), and computer program products according to embodiments of the inventive subject matter. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present inventive subject matter. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
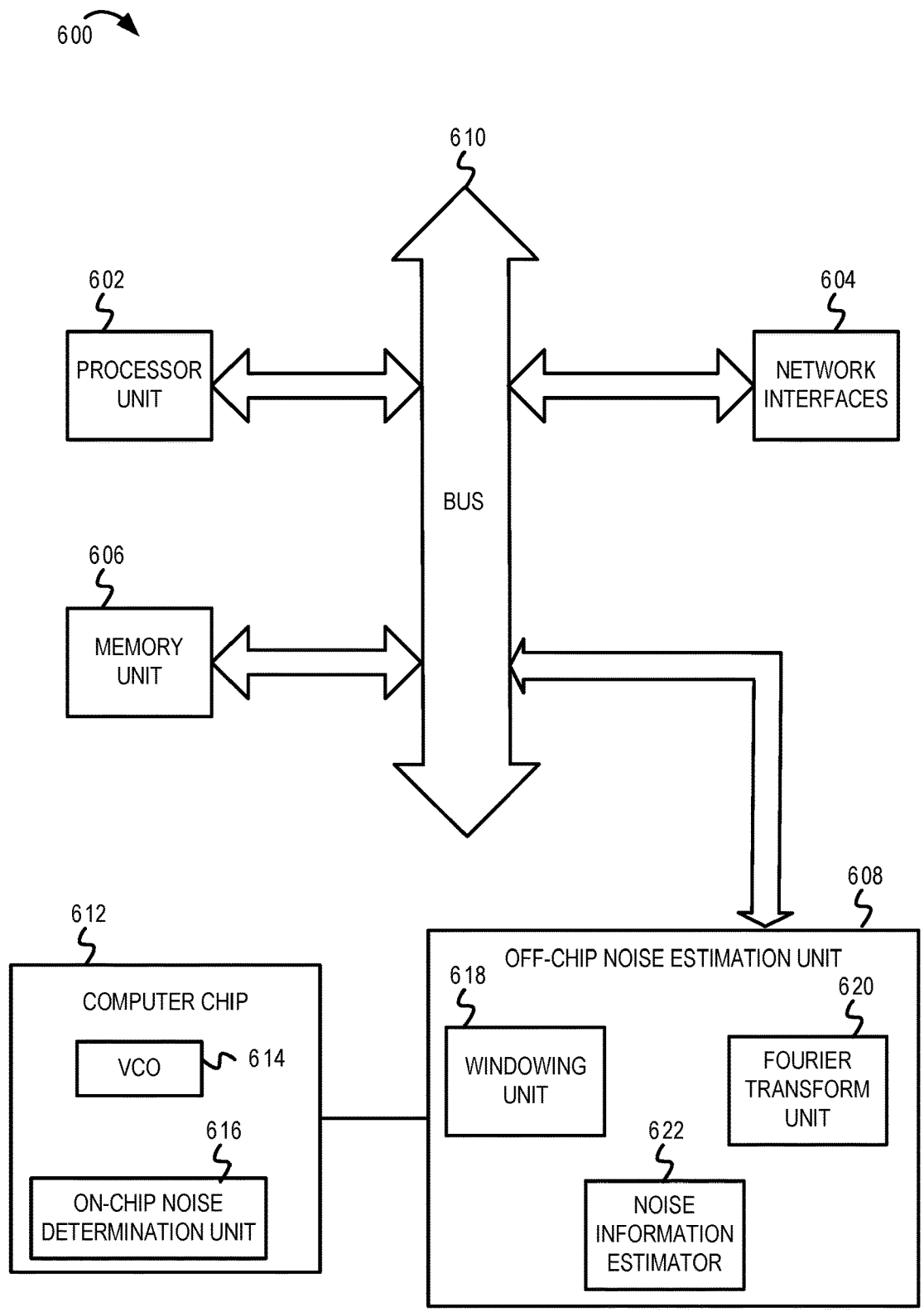
FIG. 6 is a block diagram illustrating one embodiment of an electronic device including a mechanism for on-chip noise estimation.

FIG. 6 is a block diagram of one embodiment of an electronic device 600 including a mechanism for on-chip noise estimation. In some embodiments, the electronic device 600 can be a laptop computer, a tablet computer, a netbook, a mobile phone, a smart appliance, a wearable device, a gaming console, a desktop computer, a network bridge device, or other suitable electronic device including processing capabilities. For example, the electronic device 600 can be a network device that implements communication protocols for exchanging communications with another network device. The electronic device 600 includes a processor unit 602 (possibly including multiple processors, multiple cores, multiple nodes, and/or implementing multi-threading, etc.). The electronic device 600 includes a memory unit 606. The memory unit 606 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of computer-readable storage media. The electronic device 600 also includes a bus 610 (e.g., PCI, ISA, PCI-Express, HyperTransport®, Infini-Band®, NuBus, AHB, AXI, etc.) and network interfaces 604. The processor unit 602, the memory unit 606, and the network interfaces 604 are coupled to the bus 610. The network interfaces 604 include a wireless network interface (e.g., a WLAN interface, a Bluetooth® interface, a WiMAX interface, a ZigBee® interface, a Wireless USB interface, etc.) and/or a wired network interface (e.g., a powerline communication interface, an Ethernet interface, etc.).

The electronic device 600 also includes an on-chip noise estimation unit 608 coupled with a computer chip 612. The computer chip 612 includes an on-chip noise determination unit 616 and a VCO 614. The off-chip noise estimation unit 608 includes a windowing unit 618, a Fourier transform unit 620, and a noise information estimator 622. The computer chip 612 may be a memory chip, a processor chip, an integrated circuit (IC), an application-specific IC (ASIC), a system-on-a-chip (SoC), etc. In some embodiments, the computer chip 612 may be implemented within the processor unit 602, the memory unit 606, or another suitable processing unit. In another embodiment, the computer chip 612 may be the memory unit 606 or the processor unit 602.

For example, the processor unit 602 may include an on-chip noise determination unit and a VCO. An off-chip noise estimation unit may analyze the frequency-varying signal generated by the VCO to characterize the on-chip noise signal of the processor unit 602. As discussed above with reference to FIGS. 1-5, the on-chip noise determination unit 616 can sample the on-chip noise signal and provide the noise samples to the VCO 614. The VCO 614 can convert the on-chip noise signal to a frequency-varying signal with an instantaneous frequency that is proportional to the instantaneous voltage level of the on-chip noise signal. The windowing unit 618 can receive the frequency-varying signal at an off-chip measurement point and execute windowing operations to yield a portion of the frequency-varying signal. The Fourier transform unit 620 can convert the portion of the frequency-varying signal to a frequency-domain signal; while the noise information estimator 622 can estimate characteristics of the on-chip noise signal from the frequency-domain signal.

Any one of these functionalities may be partially (or entirely) implemented in hardware and/or on the processor unit 602. For example, the functionality of the noise estimation unit 608 may be implemented with an ASIC, in logic implemented in the processor unit 602, in a co-processor on a peripheral device or card, etc. In some embodiments, the noise estimation unit 608 can be implemented on an SoC, an ASIC, or another suitable integrated circuit that is distinct from the computer chip 612. Further, realizations may include fewer or additional components not illustrated in FIG. 6 (e.g., video cards, audio cards, additional network interfaces, peripheral devices, etc.). For example, in addition to the processor unit 602 coupled with the bus 610, the noise estimation unit 608 may include at least one additional processor unit. As another example, although illustrated as being coupled to the bus 610, the memory unit 606 may be coupled to the processor unit 602.

While the embodiments are described with reference to various implementations and exploitations, it will be understood that these embodiments are illustrative and that the scope of the inventive subject matter is not limited to them. In general, techniques for noise modulation for on-chip noise measurement as described herein may be implemented with facilities consistent with any hardware system or hardware systems. Many variations, modifications, additions, and improvements are possible.

Plural instances may be provided for components, operations, or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. A method comprising:
   receiving, by an off-chip noise estimation unit external to a computer chip, a frequency-varying signal produced by the computer chip, the frequency-varying signal representative of an on-chip noise signal determined at an on-chip determination point of the computer chip, wherein the off-chip noise estimation unit comprises at least one member of the group consisting of an integrated circuit and a processor with associated memory;
   determining, by the off-chip noise estimation unit, a subset of the frequency-varying signal;
   executing, by the off-chip noise estimation unit, time-to-frequency domain conversion operations to convert the subset of the frequency-varying signal to a corresponding frequency domain signal; and
   determining, by the off-chip noise estimation unit, a voltage level associated with the on-chip noise signal based, at least in part, on frequency information extracted from the frequency domain signal and a relationship between an input voltage provided to a voltage-controlled oscillator associated with the computer chip and an output frequency generated by the voltage-controlled oscillator.

2. The method of claim 1, wherein an instantaneous frequency of the frequency-varying signal varies according to an instantaneous voltage level of the on-chip noise signal.

3. The method of claim 1, wherein said determining the voltage level associated with the on-chip noise signal comprises:
   determining that an amplitude of the frequency domain signal exceeds a predefined threshold at a first frequency of the frequency domain signal;
   designating the first frequency as a resonant frequency of the frequency domain signal, wherein the frequency information includes the resonant frequency; and
   converting the resonant frequency to the voltage level associated with the on-chip noise signal based, at least in part, on the relationship between the input voltage provided to the voltage-controlled oscillator and the output frequency generated by the voltage-controlled oscillator.

4. The method of claim 1, further comprising:
   determining a variation in the voltage level with time based, at least in part, on the frequency information and a time interval that corresponds to the subset of the frequency-varying signal.

5. The method of claim 1, wherein said determining, by the off-chip noise estimation unit, the subset of the frequency-varying signal comprises executing windowing operations on the frequency-varying signal to yield the subset of the frequency-varying signal.

6. The method of claim 5, wherein a first window produced by the windowing operations overlaps a second window produced by the windowing operations.

7. The method of claim 1, further comprising:
   determining whether to execute noise cancellation operations at the computer chip based on at least one of the voltage level associated with the on-chip noise signal and an application executing on the computer chip.

8. A device for estimating voltage on a computer chip, the device comprising:
   an interface to communicably couple the device to an off-chip measurement point for the computer chip; and
   a noise estimation unit comprising at least one member of the group consisting of an integrated circuit and a processor with associated memory that is external to the computer chip, the noise estimation unit configured to:
      receive via the interface a frequency-varying signal produced by the computer chip, the frequency-varying signal representative of an on-chip noise signal;
      determine a subset of the frequency-varying signal;

execute time-to-frequency domain conversion operations to convert the subset of the frequency-varying signal to a corresponding frequency domain signal; and determine a voltage level associated with the on-chip noise signal based, at least in part, on frequency information extracted from the frequency domain signal and a relationship between an input voltage provided to a voltage-controlled oscillator associated with the computer chip and an output frequency generated by the voltage-controlled oscillator.

9. The device of claim 8, wherein the noise estimation unit is further configured to execute windowing operations on the frequency-varying signal to yield the subset of the frequency-varying signal.

10. The device of claim 8, wherein the noise estimation unit is further configured to:

determine that an amplitude of the frequency domain signal exceeds a predefined threshold at a first frequency of the frequency domain signal;

identify the first frequency as a resonant frequency of the frequency domain signal, wherein the frequency information includes the resonant frequency; and convert the resonant frequency to the voltage level associated with the on-chip noise signal based, at least in part, on the relationship between the input voltage provided to the voltage-controlled oscillator and the output frequency generated by the voltage-controlled oscillator.

11. The device of claim 8, wherein the noise estimation unit is further configured to:

determine a variation in the voltage level with time based, at least in part, on the frequency information, and a time interval that corresponds to the subset of the frequency-varying signal.

12. The device of claim 8, wherein the integrated circuit comprises a system on a chip.

13. The device of claim 11, wherein the integrated circuit comprises an application specific integrated circuit.

14. A system comprising:

a computer chip comprising a voltage-controlled oscillator configured to:

convert an on-chip noise signal determined at a determination point on the computer chip to a frequency-varying signal; and provide the frequency-varying signal to an off-chip measurement point for the computer chip;

an off-chip noise estimation unit that is external to the computer chip, the off-chip noise estimation unit comprising at least one member of the group consisting of an integrated circuit and a processor with associated memory, the off-chip noise estimation unit configured to:

receive the frequency-varying signal via the the off-chip measurement point;

determine a subset of the frequency-varying signal;

execute time-to-frequency domain conversion operations to convert the subset of the frequency-varying signal to a corresponding frequency domain signal; and determine a voltage level associated with the on-chip noise signal based, at least in part, on frequency information extracted from the frequency domain signal and a relationship between an input voltage provided to the voltage-controlled oscillator and an output frequency generated by the voltage-controlled oscillator.

15. The system of claim 14, wherein the off-chip noise estimation unit is further configured to execute windowing operations on the frequency-varying signal to yield the subset of the frequency-varying signal.

16. The system of claim 14, wherein the off-chip noise estimation unit is further configured to:

determine a variation in the voltage level with time based, at least in part, on the frequency information and a time interval that corresponds to the subset of the frequency-varying signal.

17. The system of claim 16, wherein the off-chip noise estimation unit is further configured to:

determine a reference output frequency of an output signal generated by the voltage-controlled oscillator for each of a plurality of reference direct current (DC) signals provided to the voltage-controlled oscillator; and determine a voltage-to-frequency conversion structure based, at least in part, on the plurality of reference DC signals and the corresponding reference output frequency, wherein the off-chip noise estimation unit is configured to determine the voltage level associated with the on-chip noise signal using the voltage-to-frequency conversion structure.

18. The system of claim 16, wherein the computer chip further comprises a noise determination unit configured to:

determine the on-chip noise signal at the determination point on the computer chip; and provide the on-chip noise signal to the off-chip measurement point.

19. The system of claim 14, wherein the integrated circuit comprises a system on a chip.

20. The system of claim 16, wherein the integrated circuit comprises an application specific integrated circuit.

* * * * *